United States Patent
Lai et al.

(10) Patent No.: US 10,396,160 B2
(45) Date of Patent: Aug. 27, 2019

(54) SEMICONDUCTOR STRUCTURE HAVING A SINGLE OR MULTIPLE LAYER POROUS GRAPHENE FILM AND THE FABRICATION METHOD THEREOF

(71) Applicant: Chang Gung University, Taoyuan (TW)

(72) Inventors: Chao-Sung Lai, Taoyuan (TW); Cher-Ming Tan, Taoyuan (TW); Preetpal Singh, Taoyuan (TW)

(73) Assignee: CHANG GUNG UNIVERSITY, Taoyuan (TW)

( * ) Notice: Subject to any disclaimer, the term of this patent is extended or adjusted under 35 U.S.C. 154(b) by 0 days.

(21) Appl. No.: 15/398,740

(22) Filed: Jan. 5, 2017

(65) Prior Publication Data
US 2018/0097066 A1  Apr. 5, 2018

(30) Foreign Application Priority Data
Oct. 4, 2016 (TW) .............................. 105131980 A

(51) Int. Cl.
*H01L 29/16* (2006.01)
*H01L 21/02* (2006.01)
(Continued)

(52) U.S. Cl.
CPC ...... *H01L 29/1606* (2013.01); *H01L 21/0242* (2013.01); *H01L 21/0254* (2013.01);
(Continued)

(58) Field of Classification Search
CPC ............. H01L 23/3732; H01L 23/3737; H01L 29/66015; H01L 29/1606; H01L 29/1054; H01L 21/0254; H01L 21/02527; H01L 21/0262; H01L 21/042; H01L 21/02109; H01L 21/022; H01L 21/02203
See application file for complete search history.

(56) References Cited

U.S. PATENT DOCUMENTS

2014/0308523 A1* 10/2014 Veerasamy ............ B82Y 30/00
428/408

OTHER PUBLICATIONS

Bai, Graphene nanomesh, Nature nanotechnology, vol. 5, Mar. 2010, pp. 190-194.*
Ni, Graphene Thickness Determination Using Reflection and Contrast Spectroscopy, Nano Letters, 2007, vol. 7, No. 0, pp. 2758-2763.*
(Continued)

*Primary Examiner* — Galina G Yushina
(74) *Attorney, Agent, or Firm* — Bacon & Thomas, PLLC

(57) ABSTRACT

A semiconductor structure having a multiple-porous graphene layer includes a sapphire substrate, a single or multiple layer porous graphene film, and a gallium nitride layer. A fabrication method for forming the semiconductor structure having a single or multiple layer porous graphene film, includes: firstly, growing up the graphene on the copper foil; then, using the acetone and isopropyl alcohol to wash the sapphire substrate, and then using the nitrogen flow to dry up; transferring the graphene onto the semiconductor substrate, using the Poly(methyl methacrylate) to fix the single or multiple layer porous graphene film, and using the acetone to wash up; using the photolithography process to etch the whole surface of the multiple-porous graphene layer; and, using the metalorganic chemical vapor deposition to deposit gallium nitride on the single or multiple layer porous graphene film and the sapphire substrate.

3 Claims, 3 Drawing Sheets

(51) Int. Cl.
- H01L 29/66 (2006.01)
- H01L 29/10 (2006.01)
- H01L 33/00 (2010.01)
- H01L 33/12 (2010.01)
- H01L 33/32 (2010.01)
- H01L 29/06 (2006.01)

(52) U.S. Cl.
CPC .... *H01L 21/0262* (2013.01); *H01L 21/02381* (2013.01); *H01L 21/02444* (2013.01); *H01L 21/02513* (2013.01); *H01L 21/02658* (2013.01); *H01L 29/1029* (2013.01); *H01L 29/66037* (2013.01); *H01L 33/007* (2013.01); *H01L 33/12* (2013.01); *H01L 33/32* (2013.01); *H01L 29/0673* (2013.01)

(56) References Cited

OTHER PUBLICATIONS

Sze, Semiconductor Devices. Physics and Technology, ed. 2, 2002, p. 292.*

WO 2016/085890, Robinson, Gallium Nitride Growth on silicon, 2016.*

Kobayashi et al. Production of a 100-m-long high-quality graphene transparent conductive film by roll-to-roll chemical vapor deposition and transfer process. Applied Physics Letters, 102, pp. 023112 (2013).*

Russo et al. Synthesis, Properties and Potential Applications of Porous Graphene: A Review. Nano-Micro Lett. 594), 260-273 (2013_, pp. 260-273.*

* cited by examiner

SEMICONDUCTOR STRUCTURE HAVING A SINGLE OR MULTIPLE LAYER POROUS GRAPHENE FILM AND THE FABRICATION METHOD THEREOF

BACKGROUND OF THE INVENTION

1. Field of the Invention

The present invention relates to a semiconductor structure having a buffer layer, particularly to a semiconductor structure having a porous graphene film and the fabrication method thereof.

2. Description of the Prior Art

In the prior art of semiconductor technology field, it is known that during the GaN epilayer growth process, i.e., when the gallium nitride (GaN) is formed on the sapphire substrate, there will usually be the disadvantage of lattice mismatch between the formed gallium nitride film and the sapphire substrate, and the thermal mismatch of thermal expansion coefficient.

Conventionally, when the gallium nitride epilayer is grown up on the sapphire substrate, a buffer layer can be formed under a low temperature condition, before the gallium nitride is formed on the sapphire substrate. It is expected that this buffer layer can reduce the big difference of lattice constant and thermal expansion coefficient between sapphire substrate and gallium nitride. It can also improve the poor effect caused by the crystallinity, and can further improve the electrical property and optical property of gallium nitride epilayer layer.

However, it is not easy to choose the material as the buffer layer formed on the sapphire substrate and there are many various use restrictions, for example, the material shall be able to meet the requirements of lattice constant and thermal expansion coefficient. Thus, in the past studies, it was pointed out that the graphene material seemed to be able to be used as the material of buffer layer formed on the sapphire substrate.

After reviewing the past studies, a thicker graphene and graphene oxide layer was used to be applied as the intermediate layer. It is applied to the sapphire substrate for the growth of gallium nitride epilayer. But, the annealing process is required to reduce the thickness of the graphene and graphene oxide layer. However, even when the annealing process is carried out, the thickness of conventional graphene and graphene oxide layer still will be up to 2.2 nm.

In many known materials at present, under room temperature, the graphene has the lowest resistance value, it is also the nano-material with minimum resistivity, and the resistance value of graphene is even lower than copper metal and aluminum metal. The graphene has extremely special properties, such as the thickness of graphene only is a single carbon atom diameter. The graphene also has other special properties, such as high mobility, high current density tolerance, and high thermal conductivity.

In addition, the graphene is undoubtedly a kind of transparent and good elastic conductor, which can receive the favor from the semiconductor industry, it is possible that a large amount of graphene might be applied to the semiconductor field in the future. On the other words, due to the special properties of graphene, it can also cooperate and follow the semiconductor field for the forward development constantly, and create more feasible application examples.

Upon overviewing the current applicable range of graphene, it not only can be applied to the semiconductor field, but also can be applied to the printed circuit boards, transmission wires and cables, mechanical chassis, automobile spare parts, and aviation equipment etc.

Therefore, in the semiconductor process, in order to respond the demand for the development of gallium nitride semiconductor fabrication technology, it is still necessary to develop the relevant gallium nitride semiconductor fabrication technology, to save the fabrication cost, and increase the use efficiency of gallium nitride semiconductor effectively.

SUMMARY OF THE INVENTION

The semiconductor structure having a multi-layer porous graphene film of the present invention comprises a sapphire substrate, a multiple-porous graphene layer, and a gallium nitride layer.

The semiconductor structure having a multi-layer porous graphene film of the present invention uses three kinds of different structure, the number of graphene layer may be one layer, two layer, and three layers.

The fabrication method for forming the semiconductor structure having a multi-layer porous graphene film of the present invention comprises the following steps: firstly, growing up the graphene on the copper foil by the metalorganic chemical vapor deposition via passing through the methane and hydrogen; then, using the acetone and isopropyl alcohol to wash the sapphire substrate, and then using the nitrogen flow to dry up; transferring the graphene onto the sapphire substrate to become the multi-layer porous graphene film by using the ferric chloride as the copper etchant to etch the copper foil, using the Poly(methyl methacrylate) to fix the graphene layer, and using the acetone to wash up; using the photolithography process to etch the whole surface of the multi-layer porous graphene film to form pores; and, using the metalorganic chemical vapor deposition to deposit gallium nitride on the multi-layer porous graphene film and the sapphire substrate.

As the purpose of using the multi-layer porous graphene film of the present invention, it not only can reduce the problem of lattice mismatch effectively, but also can eliminate the thermal mismatch phenomenon between the gallium nitride and the sapphire substrate.

The present invention uses the multi-layer porous graphene film as the buffer layer, which is formed between the gallium nitride and the sapphire substrate, to increase the quality of gallium nitride epilayer. Due to the high thermal conductivity of graphite itself, it can significantly contribute to the heat dissipation efficiency of the gallium nitride and the sapphire substrate.

The present invention can reduce the defect density caused by the lattice mismatch, and the lattice defect caused by different thermal expansion coefficient, therefore the light emitting efficiency of gallium nitride light emitting diode (LED) can be increased effectively.

The multi-layer porous graphene film of the present invention has very high thermal conductivity, except there is the advantage of easy heat dissipation, and the graphene can be extensively applied to the fields of LED, solar cell, and high-electron-mobility transistor (HEMT) etc.

And what is worth mentioning, another advantage of the present invention is because the graphene is quite transparent, so when the sandwich structure is made, light still can transport out along the graphene, remain the light emitting effect of LED constantly.

Therefore, the advantage and spirit of the present invention can be understood further by the following detail description of invention and attached FIGS. 1 to 3.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The attached figures should be used to describe the implement way of the present invention. In the figures, the same element symbol is used to represent the same element, in order to describe the element more clearly, its size or thickness might be scaled.

Figure 1:
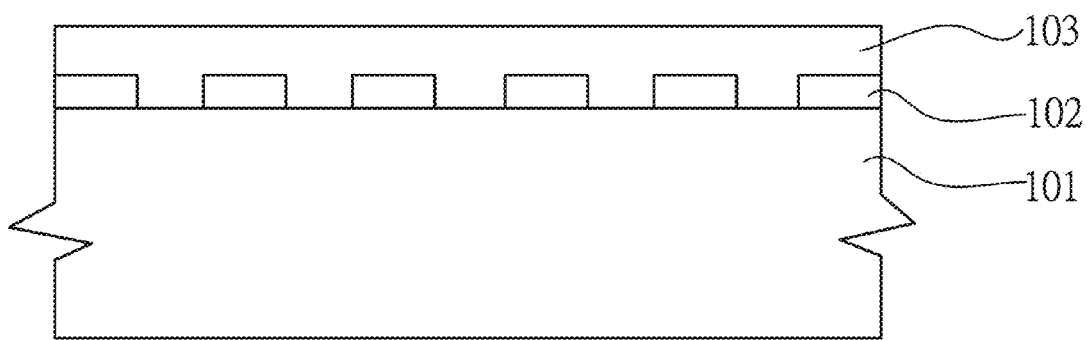
FIG. 1 illustrates the cross-sectional diagram for a semiconductor structure having a multi-layer porous graphene film of the present invention.

Please refer to FIG. 1 that illustrates the cross-sectional diagram for a sapphire structure 101 having a multi-layer porous graphene film 102 of the present invention. FIG. 1 shows the sapphire substrate 101, herein after the silicon sapphire substrate 101 can also be used. The single or multi-layer porous graphene film 102 is formed on the sapphire substrate 101. The gallium nitride layer 103 is formed on the single or multi-layer porous graphene film 102, wherein when the porous graphene film 102 is a single-layer porous graphene film, the thickness of the multi-layer porous graphene film 102 is 0.345 nm.

Figure 2:
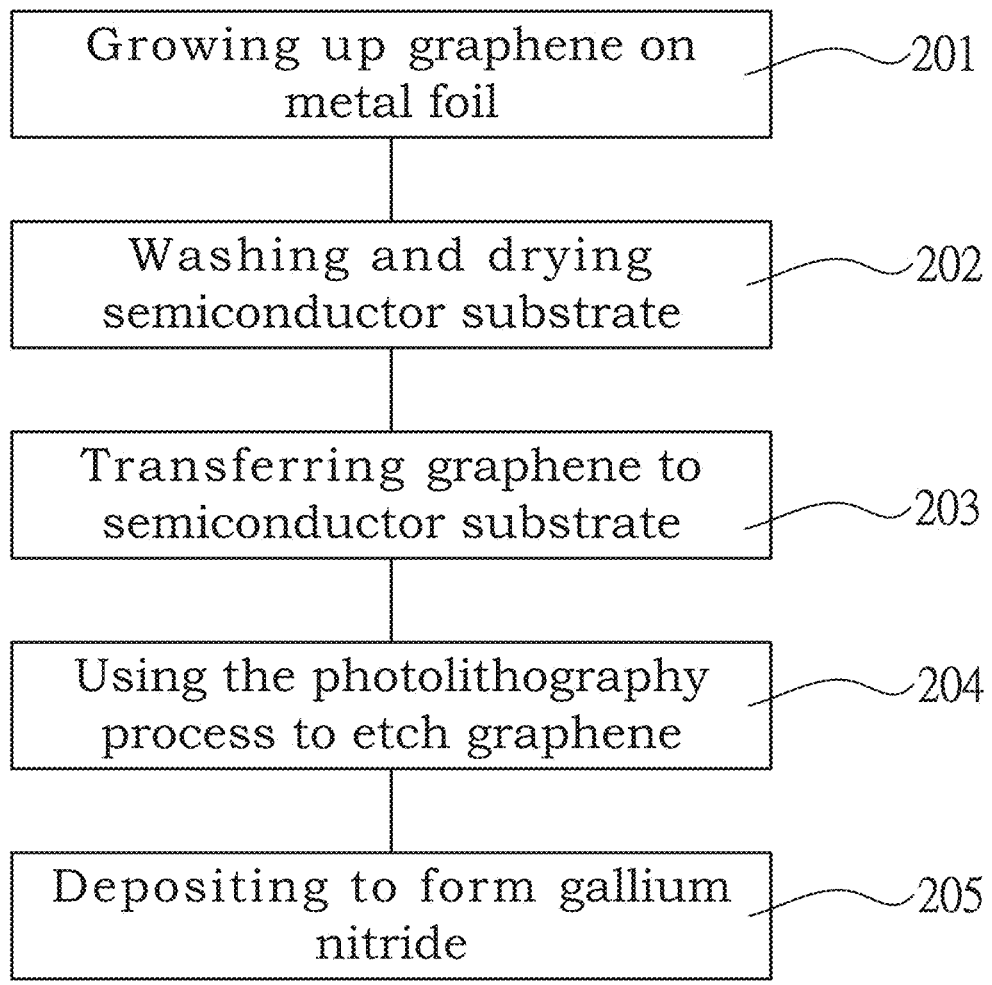
FIG. 2 illustrates the flow diagram for the fabrication method for forming the semiconductor structure having a multi-layer porous graphene film of an embodiment of the present invention.

FIG. 2 illustrates that the flow diagram for a fabrication method for forming the semiconductor structure having a multi-layer porous graphene film 102 of an embodiment of the present invention. As shown in Step 201 of FIG. 2, firstly, growing up the graphene on the metal foil by the Low Pressure chemical vapor deposition (LPCVD) at 900° C. to 1100° C., preferably at 1000° C. via passing through the methane ($CH_4$) and hydrogen ($H_2$) as the precursor, wherein, the metal foil might be Cu foil or Ni foil.

As shown in Step 202 of FIG. 2, using the acetone and isopropyl alcohol (IPA) to wash the sapphire substrate 101, and then using the nitrogen flow to dry up.

As shown in Step 203 of FIG. 2, transferring the above-mentioned graphene onto the sapphire substrate 101 to become the multi-layer porous graphene film 102, using the ferric chloride as the copper etchant to etch the copper foil, using the Poly(methyl methacrylate) to fix the multi-layer porous graphene film 102, and using the acetone to wash up.

As shown in Step 204 of FIG. 2, using the photolithography process to etch the whole surface of the multi-layer porous graphene film 102 to form about 50 g m pores for follow-up GaN growth. The thickness of the multi-layer porous graphene film 102 here is about the thickness of a single-layer porous graphene film 102, which is about 0.3 nm to 0.4 nm (better thickness is about 0.345 nm). The present invention normally can form one layer, two layers, three layers, and multiple layers of the multi-layer porous graphene film 102 structure. For instance, when the single-layer porous graphene film 102 is formed, the thickness is about 0.3 nm to 0.4 nm. When the two-layer porous graphene film 102 is formed, the thickness is about 0.6 nm to 0.8 nm. When the three-layer porous graphene film 102 is formed, the thickness is about 1 nm to 2 nm. When the multi-layer porous graphene film 102 are formed, the thickness will be depended on the number of layers.

Finally, as shown in Step 205 of FIG. 2, about 4 μm gallium nitride layer 103 is deposited on the multi-layer porous graphene film 102 and the sapphire substrate 101 by the MOCVD under at 900° C. to 1100° C., preferably at 1000° C.

Figure 3:
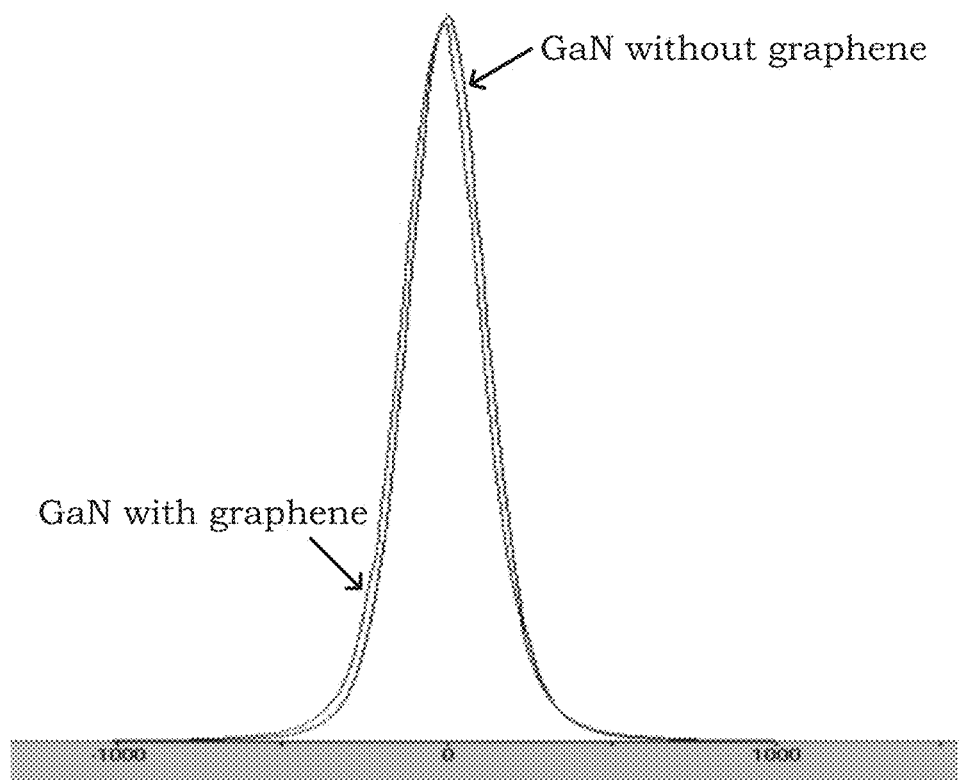
FIG. 3 illustrates the X-ray diffraction result of the present invention, which shows that the fabrication method of forming a porous graphene buffer film yields x-ray diffraction results that match those of a conventional structure without the graphene buffer layer.

FIG. 3 shows that the X-ray diffraction results of the present method for forming the semiconductor structure having a porous graphene buffer film 102 match those of a semiconductor structure without the graphene buffer film, verifying that the present fabrication method is practical. The multiple-porous graphene buffer layer comprises but not limited to single layer or multiple layers.

The graphene of the present invention has very high thermal conductivity, except there is the advantage of easy heat dissipation, and it can be extensively applied in the fields of LED, solar cell, and high-electron-mobility transistor (HEMT) etc. In addition, what is worth mentioning, another advantage of the present invention is because the multi-layer porous graphene film is quite transparent, thus, when the sandwich structure is made, light still can transport out along the multi-layer porous graphene film, remain the light emitting effect of LED constantly.

The present invention uses the multi-layer porous graphene film as buffer layer, which is formed between the gallium nitride 103 and the sapphire substrate 101, to increase the quality of gallium nitride epilayer. Due to high thermal conductivity of multi-layer porous graphene film 102 itself, it the graphene film 102 can significantly contribute to the heat dissipation efficiency of the gallium nitride 103 and the sapphire substrate 101. And because the present invention has very high thermal conductivity, it can reduce the defect density caused by lattice mismatch, and the lattice defect caused by different thermal expansion coefficient. Therefore, the light emitting efficiency of gallium nitride light emitting diode (LED) can be increased effectively.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed:

1. A semiconductor structure having a single-layer porous graphene film with a thickness of about 0.34 nm, formed by a low pressure chemical vapor deposition (LPCVD) and a metalorganic chemical vapor deposition (MOCVD), comprising:

a sapphire substrate;

wherein said single-layer porous graphene film having the thickness of about 0.34 nm is provided on said sapphire substrate, said single-layer porous graphene film being formed on a metal foil by the low pressure chemical vapor deposition (LPCVD) at 900° C. to 1100° C. via passing through methane (CH$_4$) and hydrogen (H$_2$), wherein said metal foil is selected from a group consisting of a Cu foil or Ni foil; and wherein a gallium nitride layer is formed on said single-layer porous graphene film, said gallium nitride being deposited on said single-layer porous graphene film and said sapphire substrate by using the metalorganic chemical vapor deposition (MOCVD) at 900° C. to 1100° C.

2. A semiconductor structure having a two-layer porous graphene film with a thickness of about 0.7 nm, formed by a low pressure chemical vapor deposition (LPCVD) and a metalorganic chemical vapor deposition (MOCVD), comprising:

a sapphire substrate;

said two-layer porous graphene film having the thickness of about 0.7 nm is provided on said sapphire substrate, said two-layer porous graphene film being formed on a metal foil by the low pressure chemical vapor deposition (LPCVD) at 900° C. to 1100° C. via passing through methane (CH$_4$) and hydrogen (H$_2$), wherein said metal foil is selected from a group consisting of a Cu foil or Ni foil; and wherein a gallium nitride layer is formed on said two-layer porous graphene film, said gallium nitride being deposited on said two-layer porous graphene film and said sapphire substrate by using the metalorganic chemical vapor deposition (MOCVD) at 900° C. to 1100° C.

3. A semiconductor structure having a three-layer porous graphene film with a thickness of about 1 nm, formed by a low pressure chemical vapor deposition (LPCVD) and a metalorganic chemical vapor deposition (MOCVD), comprising:

a sapphire substrate;

said three-layer porous graphene film having the thickness of about 1 nm is provided on said sapphire substrate, said three-layer porous graphene film being formed on a metal foil by the low pressure chemical vapor deposition (LPCVD) at 900° C. to 1100° C. via passing through methane (CH$_4$) and hydrogen (H$_2$), wherein said metal foil is selected from a group consisting of a Cu foil or Ni foil; and wherein a gallium nitride layer is formed on said three-layer porous graphene film, said gallium nitride being deposited on said three-layer porous graphene film and said sapphire substrate by using the metalorganic chemical vapor deposition (MOCVD) at 900° C. to 1100° C.

* * * * *